United States Patent [19]

Jones et al.

[11] Patent Number: 4,644,633

[45] Date of Patent: Feb. 24, 1987

[54] COMPUTER CONTROLLED LEAD FORMING

[75] Inventors: Steven P. Jones; David J. Tilles, both of Baltimore, Md.

[73] Assignee: The United States of America as represented by the Secretary of the Air Force, Washington, D.C.

[21] Appl. No.: 768,664

[22] Filed: Aug. 23, 1985

[51] Int. Cl.⁴ ............................................. B21F 45/00
[52] U.S. Cl. .................................. 29/566.3; 140/105; 29/593
[58] Field of Search ................... 29/566, 566.1, 566.2, 29/566.3, 715, 729, 737, 741, 621, 593; 227/76, 84; 140/105; 72/DIG. 10

[56] References Cited

U.S. PATENT DOCUMENTS

| | | | |
|---|---|---|---|
| 2,799,051 | 7/1957 | Coler et al. | 29/593 |
| 3,092,253 | 6/1963 | Senger | 29/593 |
| 3,147,779 | 9/1964 | Brown | 140/71 |
| 3,475,998 | 11/1969 | Steiner et al. | 408/8 |
| 3,945,408 | 3/1976 | Halligan | 140/105 |
| 3,993,108 | 11/1976 | Kirschenman | 140/105 |
| 4,072,177 | 2/1978 | Daebler | 140/105 |
| 4,108,217 | 8/1978 | Westberg, II | 140/105 |
| 4,198,741 | 4/1980 | Wheeler et al. | 29/566 |
| 4,203,477 | 5/1980 | Bruller | 140/105 |
| 4,411,059 | 4/1984 | Watanabe | 408/11 |
| 4,447,945 | 5/1984 | Priscsak | 29/566.3 |
| 4,561,058 | 12/1985 | McMurtry | 408/13 |

Primary Examiner—Gil Weidenfeld
Assistant Examiner—Arthur Dougas
Attorney, Agent, or Firm—William G. Auton; Donald J. Singer

[57] ABSTRACT

An axial lead forming machine is presented which is capable of trimming, shaping, and electrically verifying the characteristics of axial components under computer control. Two die cutting and bending assemblies are incrementally moved horizontally over the wire leads of an axial component, which is suspended between them. A set of counters, lead screws, and two electric motors initially hold the two die assemblies in a known position defined as a "home" location. By correlating the number of leads per inch on the lead screws and counting the number of rotations of the electric motor, the lead forming mechanism is capable of communicating to a computer the exact location of the hammer, anvil and cutting edge of the die assemblies so that a programmable setting of the trimming and shaping of the axial leads may be accomplished automatically under computer direction.

10 Claims, 10 Drawing Figures

CONTAINERIZATION, 301

STAGING AND RETRIEVAL, 302

KITTING, 303

BAR CODE

TRAY

GROOVED INSERT TO HOLD COMPONENT LEADS

COMPUTER CONTROLLED LEAD FORMING

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to the manufacturing of electrical components and specifically to an automated lead forming system for axial electrical components.

The fabrication of printed circuit boards often includes the forming of wire-like leads of axial components. This "forming" step includes the cutting of the leads to a specific length, and the bending of the leads into a tailored configuration, using axial forming equipment.

Setup and adjustment of axial forming equipment is currently a labor intensive manual operation. Lead forming equipment is configured to operate with one set of dies that are dedicated to a specific lead shape and range of diameters. Each different lead shape or range of lead diameters require a die change involving shutting the machine down, determining and retrieving the proper die set from tool cribs, and removing and replacing the dies. Changes in lead center to center spacing require shutting the machine down, loosening dies, and manually adjusting their positions. These characteristics of currently available equipment require large lot sizes for cost-effective operation. Present component forming methods will be incompatible with the robotic and automated assembly techniques being developed for modern assembly plants.

The task of automating axial lead forming is alleviated, to some extent, by the following U.S. Patents, which are incorporated herein by reference U.S. Pat. No 3,147,779, issued to B. Brown on Sept. 8, 1964;

U.S. Pat. No. 3,993,108, issued to Kirschenman et al on Nov. 23, 1976;

U.S. Pat. No. 3,945,408, issued to Halligan on Mar. 23, 1976;

U.S. Pat. No. 4,072,177, issued to Daebler on Feb. 7, 1978;

U.S. Pat No. 4,203,477, issued to Bruller et al on May 20, 1980; and

U.S. Pat. No. 4,447,945, issued to Priscsak on May 15, 1984.

All of the above references disclose lead forming machines, with various degrees of automation. For example, the Bruller et al reference discloses an apparatus that automatically cuts and clinches leads which are extended through a circuit board. The Halligan reference discloses an apparatus for automatically forming and trimming the lead wires of transistors and like electrical components, which have a plurality of leads extending from a potted body.

While the references cited above enhance mass production, some degree of manual operation is retained by all of them. The degree of manual operation retained in these references ranges from the initial setting of dies to constant supervision.

In view of the foregoing discussion, it is apparent that there currently exists the need for a programmably adjustable lead forming system, with die settings that are adjustable by computer control. The present invention is intended to satisfy that need.

SUMMARY OF THE INVENTION

The present invention is an axial lead forming machine capable of forming and trimming axial leads with a variety of diameters into a variety of shapes using die assemblies that are capable of being incrementally adjusted by a computer. The trimming and shaping of axial leads is accomplished using two incrementally adjustable die assemblies which shape and trim an axial lead which is suspended between them by a clamp.

Each die assembly consists of cutters, a hammer and an anvil that are positioned together as units. Two of these die assemblies are incorporated into one machine by fixing the dies relative to one and another on incrementally adjustable platforms. The left side of each die assembly is fixed to one platform, and driven by one motor, and the right side of each assembly is fixed to another platform, and drive by a second motor. This allows the center of the dies (the "target" point for a robot) to remain in a fixed location, while the dies move apart for large components, and together for small ones. The top sections of the die assemblies travel along a camshaft, that drives the dies together and apart during the lead cutting and forming cycle. All die positions are referenced to a "home" position determined by driving the dies to a known location and setting all counters and sensors to zero.

In one embodiment the horizontal adjustments of each die assembly is provided using two lead screws with 20 leads per inch and an encoder having 200 counts per revolution. The "home" position is defined as having the die assemblies positioned horizontally in the fully closed position. From the "home" position, which is a known location, the lead forming apparatus can receive precise bend and shaping instructions since the dies may be moved incrementally.

Additionally, each incrementally adjustable die assembly possesses a set of connecting electrodes which allow the axial component to be electrically verified before the shaping and trimming procedures begin. If the axial component proves defective during the electrical verification check, it is discarded and a new axial component may be inserted for processing.

It is an object of the present invention to provide an axial and forming machine capable of computer controlled die setting.

It is another object of the present invention to form axial leads with a variety of wire diameters into a variety of shapes.

It is another object of the present invention to perform both lead forming and electrical verification of axial components at one location.

These together with other objects features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention is an axial lead forming machine with incrementally adjustable die assemblies capable of shaping and trimming axial leads with computer controlled die settings, and performing electrical verification and lead forming at one location.

Figure 1:
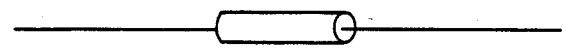
FIG. 1 is an illustration of an axial electrical component.

FIG. 1 is an illustration of an axial electrical component which is processed by the present invention. As illustrated, axials are electrical components with leads at the ends. The present invention is designed to shape and trim the leads of axial components, as distinguished from: radials (components with parallel leads, such as small value capacitors); cans (components such as transistors); and integrated circuits.

While the present invention has no inherent limitations as to the size of the axial component to be processed, the preferred embodiment of the invention was constructed to shape and trim axial components having the range of dimensions depicted in Table 1.

TABLE 1

|  | Axial Component Dimensions |
|---|---|
| Body length | .160–1.30 inches |
| Body diameter | .074–.43 inches |
| Lead diameter | .016–.042 inches |
| Overall length | 3.5 inches maximum |
| Lead center to center | .40–1.50 inches |

Figure 2A:
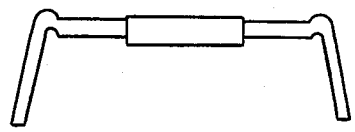
FIGS. 2a, 2b and 2c are illustrations of various output configurations of axial components.
Figure 2B:
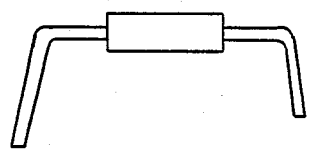
Figure 2C:
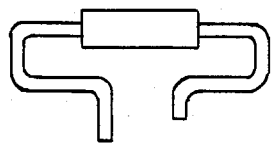

FIGS. 2a, 2b and 2c are illustrations of various output configurations of axial components after they have been shaped and trimmed by the preferred embodiment of the present invention. Maximum lead spacing is 1.5 inches.

The lead forming machine of the present invention is planned for use as part of a material accountability and robotic kitting (MARK) system, which provides a fully automated approach to the staging and processing of electronic components to produce planar printed circuit cards. All operations including parts picking, kitting, and lead forming are performed automatically under computer control to assemble between 6,000 and 8,000 printed circuit boards each month.

Figure 3:
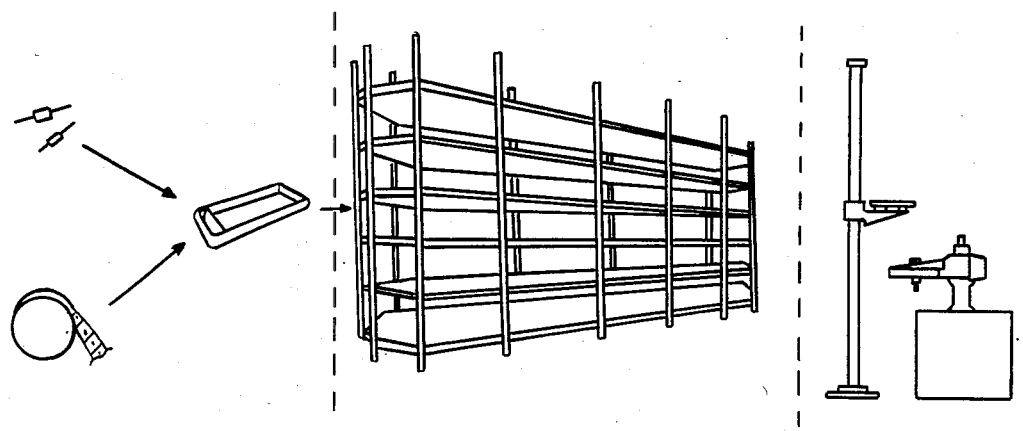
FIG. 3 is a schematic representation of the robotic kitting system used with the present invention.

FIG. 3 is a schematic representation of the MARK system which is used with the present invention. The MARK system is divided into three subsystems: containerization 301, staging and retrieval 302 and kitting 303. In the containerization subsystem 301, all printed circuit parts are stored into a standard tray.

Figure 5:
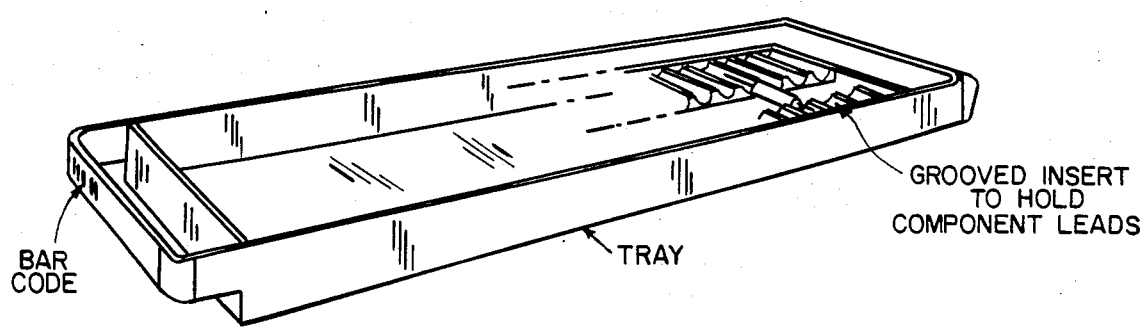
FIG. 5 is an illustration of a standard tray used with the robotic kitting system.
Figure 4:
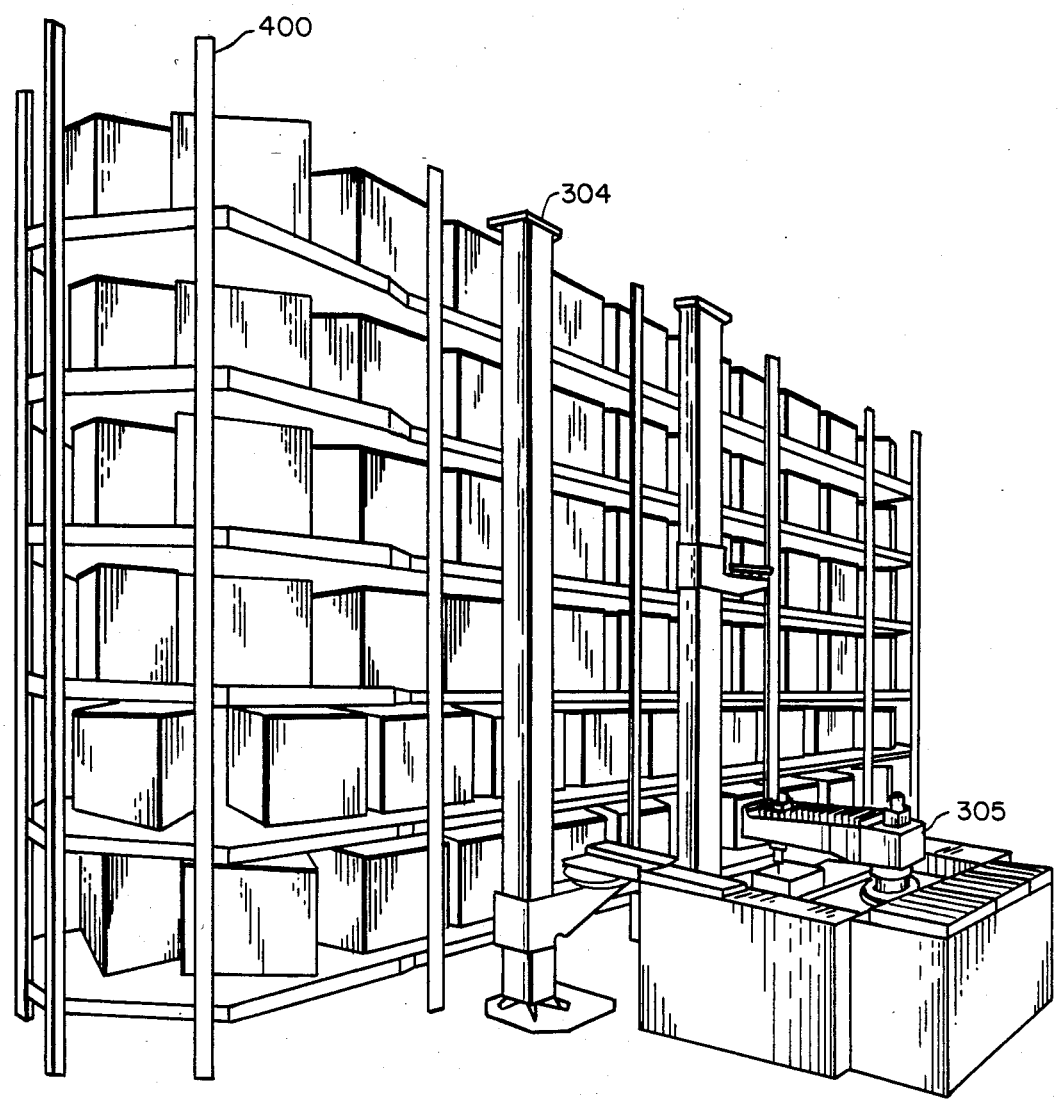
FIG. 4 is an illustration of the robotic kitting system of FIG. 3.

In the staging and retrieval subsystem 302, the trays are organized into known locations on a carousel. This known location allows the control computer to direct the carousel elevator 304 to retrieve any tray of known parts, and deliver it to the kitting robot 305 in the kitting stage 303. It is at the kitting stage 303 that the present invention is used to prepare axial components for insertion into a circuit card by shaping and trimming the axial component, which is held in a known, fixed position by the kitting robot 305. FIG. 4 is an illustration of the kitting system in front of carousel, and FIG. 5 is an illustration of a standard tray stored in the carousel 400.

Figure 6:
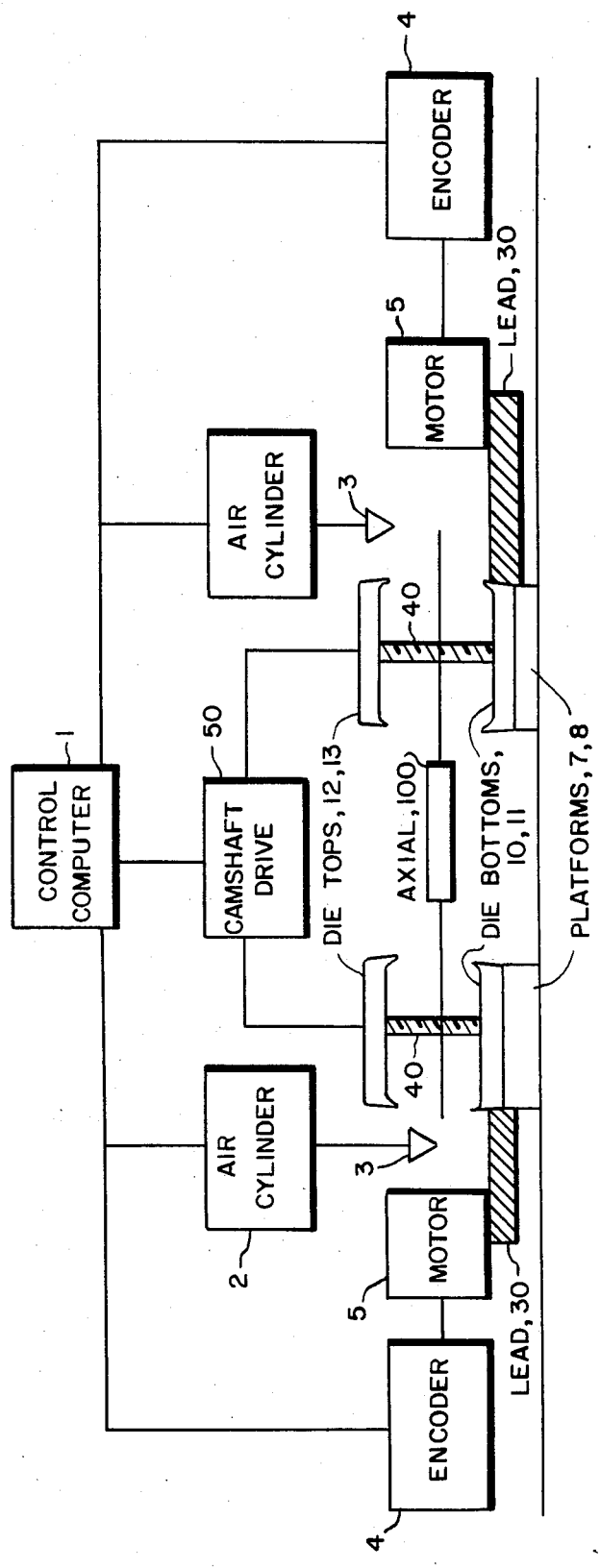
FIG. 6 is a block diagram of the present invention.

FIG. 6 is a block diagram of the preferred embodiment of the present invention. The purpose of this apparatus is to shape and trim axial leads, such as the one depicted in FIG. 1 into configurations, such as those depicted in FIG. 2, using two die assemblies whose settings may be controlled by a computer.

To accomplish the above, the present invention uses two incrementally adjustable die assemblies which receive instructions from a control computer 1. In the embodiment of FIG. 6, the control computer 1 is the same computer which directs the kitting robot 305 of FIG. 3.

The forming operation begins when the robot indicates to the control computer 1 that a specified axial component 100 has been placed into the die assembly. The control computer first performs an electrical verification (EV) of the axial component by directing the air cylinders 2 to extend contacts of an EV system 3 down to the leads on either side of the axial component 100. The EV system 3 tests the part and relays the readings to the computer 1, which compares them with the expected values for the part. If the readings compare favorably, the computer will continue the forming and trimming operation. If the readings do not favorable compare, the computer will direct the kitting robot to discard the part. If the axial leads are all resistors, this EV system may simply be an ohm meter.

If the EV test is successfully completed, the next step is the trimming of the leads at a specified length. The bottoms of the left and right die assemblies 10–13 rest on platforms 7 and 8 which are incrementally driven apart and together towards the axial component by the two lead screws 30, as rotated by the two electric motors 5. In this embodiment, lead screws which have 20 leads per inch were used with the result that 20 revolutions on a single lead moves the platform one inch in a known direction.

So that the computer always knows exactly where the die assemblies are positioned, the die positions are referenced to a "home" position, and setting the encoder to zero at that position. In this embodiment, the "home" position is defined as having the dies in the fully closed position. Each encoder 4, in this embodiment, has correlated 200 counts per revolution. Therefore, if a desired center to center distance is 1.4 inches, each motor 5 is instructed to turn the leads until the encoder reading is 5600 counts.

When the die assemblies have been horizontally positioned with their cutting edges at the trim locations, the control computer 1 triggers the camshaft drive 50 to cause each of the camshafts 40 to bring the cutting edge in the top of the die assemblies 12, 13 down onto the cutting plate in the die bottoms 10, 11. The top and bottom sections of a single die assembly are illustrated in further detail in FIGS. 7 and 8.

Once the trimming step is completed, the computer directs the die assemblies to move horizontally to specified locations before directing the camshafts to close the dies to bend the leads. In the embodiment of FIG. 6, the vertical height to which the top and bottom sections of each die assembly would close was determined by the bending requirements exclusively. As will be seen in FIGS. 7 and 8, the prominent cutting edge and cutting plate of the die assembles allow the leads to be cut regardless of the heights to which the dies closed. The vertical separation of the top and bottom sections of the die assemblies is made by adjusting the allowable travel in each of the camshafts 40. In operating the present invention, it has been found that one vertical setting has sufficed for all axial components, since they are installed in standardized bread boards, and that dynamic changes in vertical heights are unnecessary.

Figure 7:
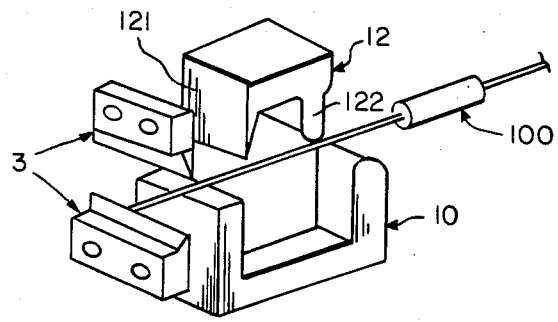
FIG. 7 is a mechanical schematic of the left die assembly of the present invention.
Figure 8:
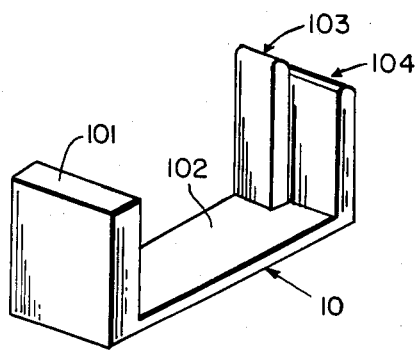
FIG. 8 is a mechanical schematic of the bottom section of the left die assembly of the present invention.

FIGS. 7 and 8 are mechanical schematics of the left die assembly of the present invention. As shown in FIG. 7, the EV contacts 3 are positioned adjacent to, but electrically isolated from, the cutting edge 121 of the left die top 12.

The cutting of the lead is performed as the cutting edge 121 travels inside the protruding cutting plate 101 on the bottom section 10. The bending of the leads is accomplished as the hammer 122 in the top section of the die 12 travels towards the anvil 102 in the bottom section 10.

In the embodiment depicted in FIG. 8, the bottom section 10 of the left die has two sizes of clamps 103 and 104 protruding from the anvil 102 around which the leads are bent by the hammer 122 of the top section 12. The two sizes of the clamps 103 and 104 enable the single die assembly to accommodate two separate ranges of wire diameters.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. In combination with a control computer, which directs a kitting robot to select an axial component with known electrical characteristics and two axial leads, a lead forming apparatus for trimming and shaping said axial leads by receiving directional signals from said control computer, said lead forming apparatus comprising:

first and second die assemblies which trim and bend said axial leads in response to said direction signals from said control computer when said axial component is held suspended between them by said kitting robot; and a means for incrementally moving said first and second die assemblies horizontally into known positions, said incrementally moving means initially holding said first and second die assemblies in a "home" position, then moving said first and second die assemblies together and apart in response to an activate signal from said control computer, said incrementally moving means producing a count signal which indicates said die assemblies' position as it is being moved, and stopping said die assemblies in response to a stop signal from said control computer when they reach a desired horizontal position from which they can trim and bend said axial leads.

2. A lead forming apparatus, as defined in claim 1, wherein said incrementally moving means comprises:

first and second platforms which are connected respectively to said first and second die assemblies so that they allow free horizontal movement towards and away from each other;

first and second lead screws which have a certain number of leads per inch and are each respectively connected to the first and second platforms such that when they are rotated in a first direction, said platforms are driven horizontally together, and when they rotate in a second direction, said platforms are driven horizontally apart; and a means for rotating said first and second lead screws, said rotating means initially holding said lead screws so that said platforms are at said "home" position while maintaining a count of zero, said rotating means rotating said first and second lead screws in said said first and second directions as directed by said computer in response to said activate signal, said rotating means producing a count signal which indicates a number of revolutions it has rotated said first and second lead screws, said rotating means stopping rotation of said lead screws in response to a stop signal from said control computer.

3. A lead forming apparatus, as defined in claim 2, wherein said rotating means comprises:

first and second electric motors each respectively connected to and rotating said first and second lead screws when receiving an electrical signal; and first and second encoders which are electrically connected to said control computer and connected respectively to said first and second electric motors, said encoders producing said electrical signal for said electric motors in response to said activate signal from said computer, said first and second encoders sending said count signal to said computer to indicate the number of revolutions said electric motors have made, and said first and second encoders ceasing to produce said electrical signal for said motors in response to a stop signal from said control computer.

4. A lead forming apparatus, as defined in claim 3, wherein said first and second die assemblies each comprises:

a top section containing a hammer for bending said axial leads, and a cutting blade for trimming said leads, said hammer being positioned closer to said axial components center section then the cutting blade;

a bottom section being fixed on one of said first and second platforms beneath said top section, said bottom section having an anvil formed by a flat base section, a protruding cutting plate on one side, and a protruding bending section on its other side, said protruding bending section being positioned closer to said axial component's center then said protruding cutting plate;

an adjustable camshaft which drives said top section down on said bottom section at adjustable heights to bend and trim said axial leads; and a means for driving said adjustable camshaft which receives said direction signals from said control computer, then physically drives said camshaft so that it moves said top section down to said bottom section and back.

5. A lead forming apparatus, as defined in claim 4, wherein said said protruding bending section of said bottom section has at least two top surface areas for bending axial leads with different ranges of wire diameters, said top surface areas having two different widths.

6. A lead forming apparatus, as defined in claim 5, including a means for electrically verifying said known electrical characteristics of said axial component;

first and second electrical contacts which are electrically connected to said electrically verifying means and conduct signals along said axial leads when contacting them; and a means for placing said electrical contacts against said axial leads when directed by said control computer.

7. A lead forming apparatus, as defined in claim 6, wherein said placing means comprises a pneumatic air cylinder mechanism which extends and extracts said first and second electrical contacts when directed by said control computer.

8. A lead forming apparatus, as defined in claim 6, wherein said electrically verifying means comprises an ohm meter which sends signals through said axial leads through said first and second electrical contacts, and relays its readings to said control computer which compares them with the known electrical characteristics expected of said axial component.

9. In combination with a control computer, which directs a kitting robot to select an axial component with known electrical characteristics and two axial leads, a lead forming apparatus for trimming and shaping said axial leads by receiving directional signals from said control computer, said lead forming apparatus comprising:

first and second die assemblies which trim and bend said axial leads in response to said direction signals from said control computer when said axial component is held suspended between them by said kitting robot;

first and second platforms which are connected respectively to said first and second die assemblies so that they allow free horizontal movement towards and away from each other;

first and second lead screws which have a certain number of leads per inch and are each respectively connected to the first and second platforms such that when they are rotated in a first direction, said platforms are driven horizontally together, and when they rotate in a second direction, said platforms are driven horizontally apart; and a means for rotating said first and second lead screws, said rotating means initially holding said lead screws so that said platforms are at a "home" position while maintaining a count of zero, said rotating means rotating said first and second lead screws in said first and second directions as directed by said computer in response to an activate signal, said rotating means producing a count signal which indicates a number of revolutions it has rotated said first and second lead screws, said rotating means stopping rotation of said lead screws in response to a stop signal from said control computer.

10. A lead forming apparatus, as defined 9, wherein said rotating means comprises:

first and second electric motors each respectively connected to and rotating said first and second lead screws when receiving an electrical signal; and first and second encoders which are electrically connected to said control computer and connected respectively to said first and second electric motors, said encoders producing said electrical signal for said electric motors in response to said activate signal from said computer, said first and second encoders sending said count signal to said computer to indicate the number of revolutions said electric motors have made, and said first and second encoders ceasing to produce said electrical signal for said motors in response to a stop signal from said control computer.

* * * * *